United States Patent
Stapelmann et al.

(10) Patent No.: US 7,902,005 B2
(45) Date of Patent: Mar. 8, 2011

(54) METHOD FOR FABRICATING A FIN-SHAPED SEMICONDUCTOR STRUCTURE AND A FIN-SHAPED SEMICONDUCTOR STRUCTURE

(75) Inventors: Chris Stapelmann, Tervuren (BE); Thomas Schulz, Heverlee (BE)

(73) Assignee: Infineon Technologies AG, Neubiberg (DE)

( * ) Notice: Subject to any disclaimer, the term of this patent is extended or adjusted under 35 U.S.C. 154(b) by 528 days.

(21) Appl. No.: 11/934,665

(22) Filed: Nov. 2, 2007

(65) Prior Publication Data

US 2009/0114955 A1    May 7, 2009

(51) Int. Cl.
*H01L 21/00* (2006.01)
(52) U.S. Cl. .................. 438/156; 257/E21.629
(58) Field of Classification Search .............. 438/156, 438/173, 192, 206, 209, 212, 268
See application file for complete search history.

(56) References Cited

U.S. PATENT DOCUMENTS

| 2005/0048727 | A1* | 3/2005 | Maszara et al. | 438/285 |
| 2006/0284255 | A1* | 12/2006 | Shin et al. | 257/351 |
| 2007/0063230 | A1* | 3/2007 | Anderson et al. | 257/274 |
| 2007/0249130 | A1* | 10/2007 | Anderson et al. | 438/301 |

FOREIGN PATENT DOCUMENTS

EP    1 519 420 A2    3/2005

OTHER PUBLICATIONS

Smith, C. S., "Piezoresistance Effect in Germanium and Silicon," Physical Review, vol. 94, No. 1, Apr. 1, 1954, pp. 42-49.
Yang, M., et al., "High Performance CMOS Fabricated on Hybrid Substrate With Different Crystal Orientations," IEEE, Mar. 2003, 4 pages.
Chen, C., et al., "Stress Memorization Technique (SMT) by Selectively Strained-Nitride Capping for Sub-65nm High-Performance Strained-Si Device Application," IEEE 2004 Symposium on VSLI Technology, Jun. 15-17, 2004, pp. 56-57.
Irie, H., et al., "In-Plane Mobility Anisotropy and Universality Under Uni-Axial Strains in n- and p-MOS Inversion Layers on (100), [110], and (111) Si," IEEE, 2004, 4 pages.

* cited by examiner

*Primary Examiner* — Walter L Lindsay, Jr.
*Assistant Examiner* — Reema Patel
(74) *Attorney, Agent, or Firm* — Slater & Matsil, L.L.P.

(57) ABSTRACT

A fin-shaped structure is formed from a semiconductor material. The fin-shaped structure is processed to generate a tensile strain within the semiconductor material along a longitudinal direction of the fin.

17 Claims, 29 Drawing Sheets

PRIOR ART

PRIOR ART

FIG 4b
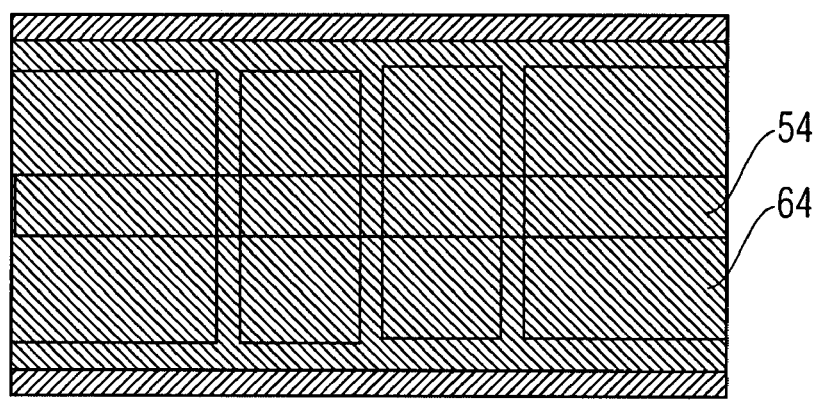
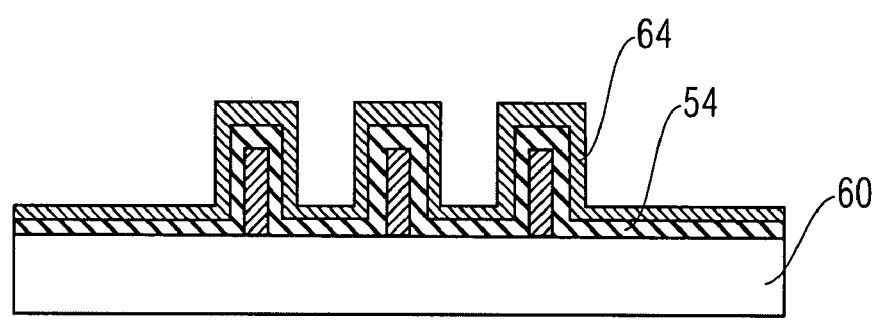

FIG 4c
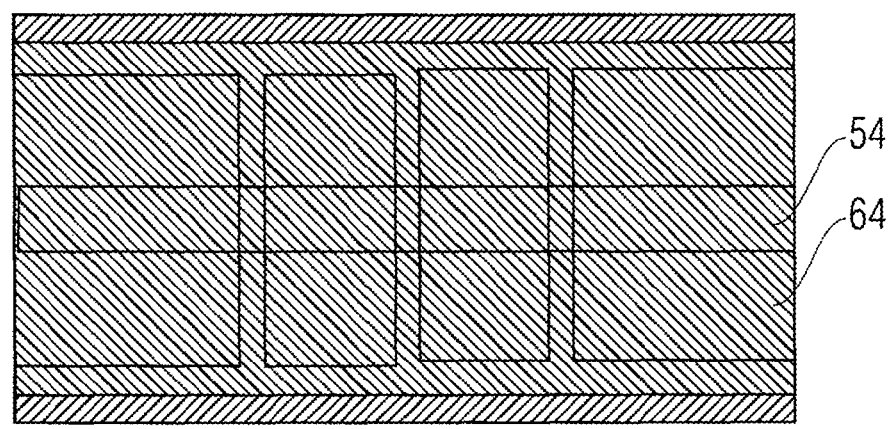
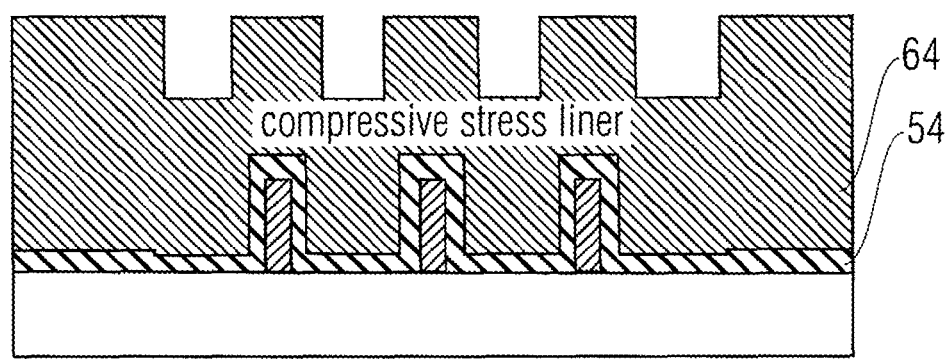

FIG 4g
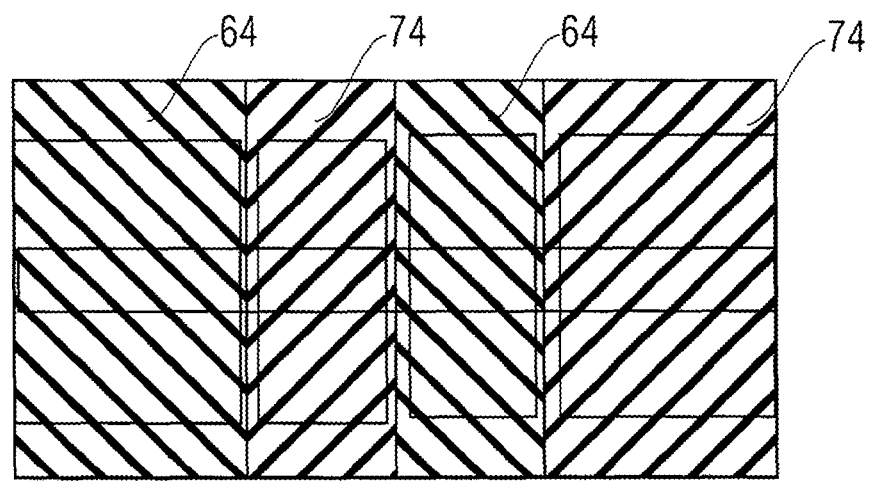
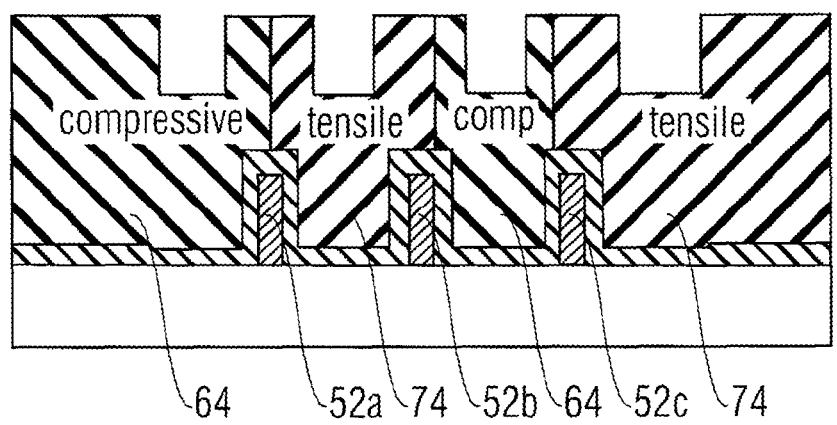

FIG 4h
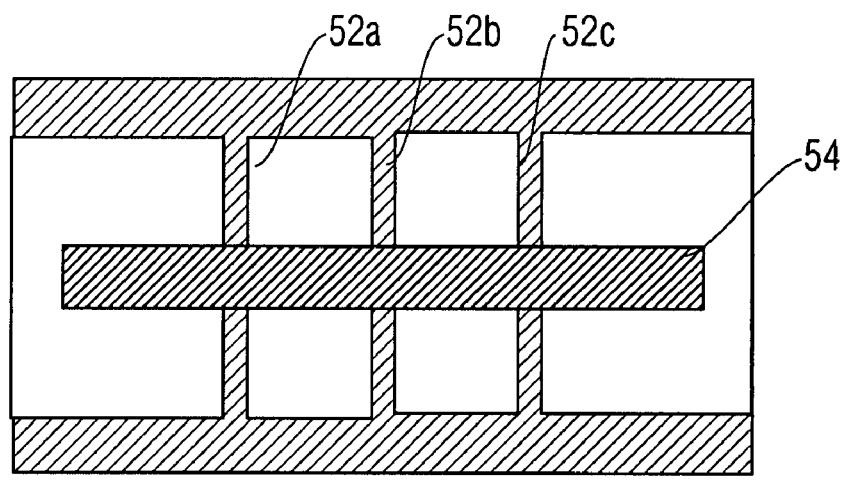
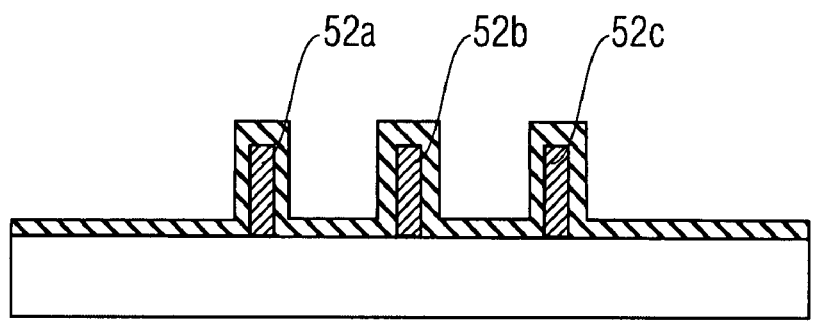

FIG 5a
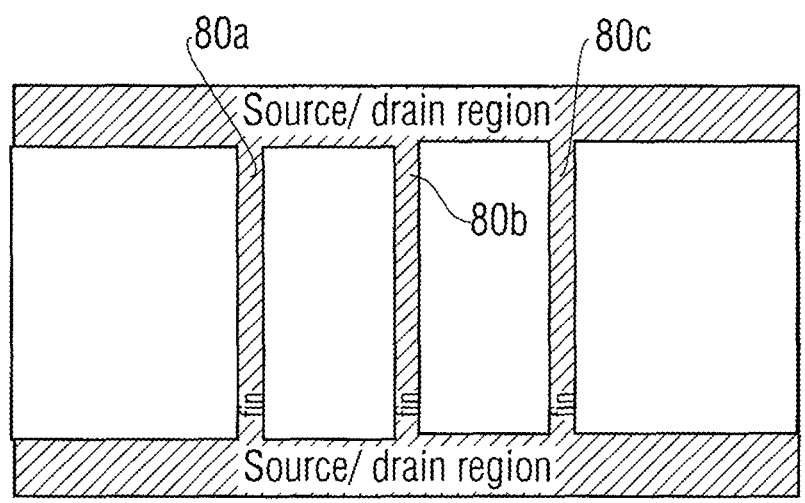
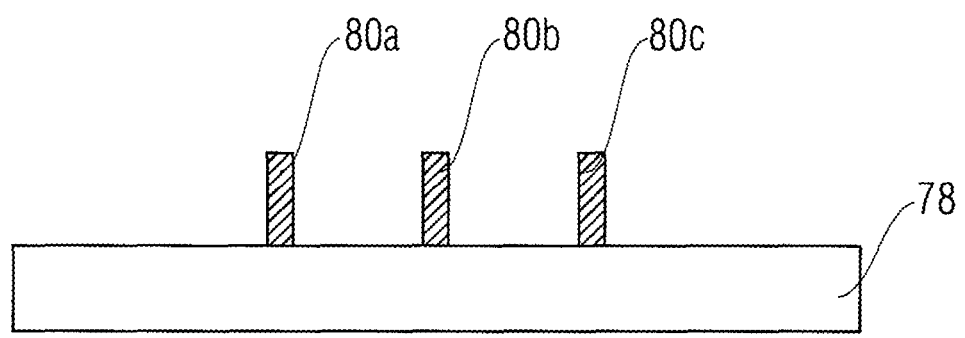

FIG 5b
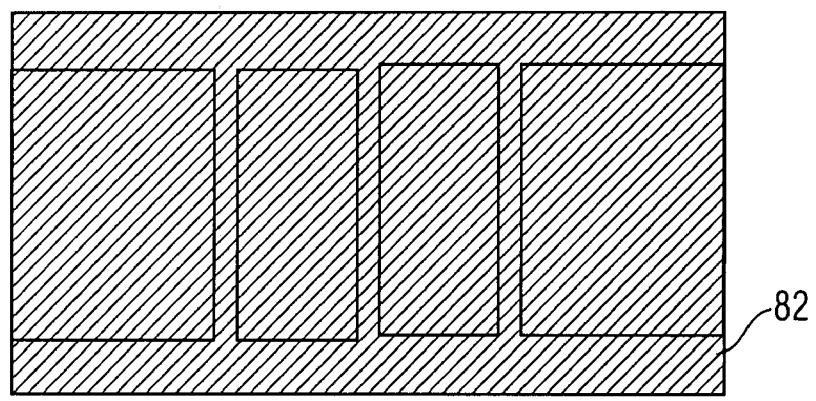
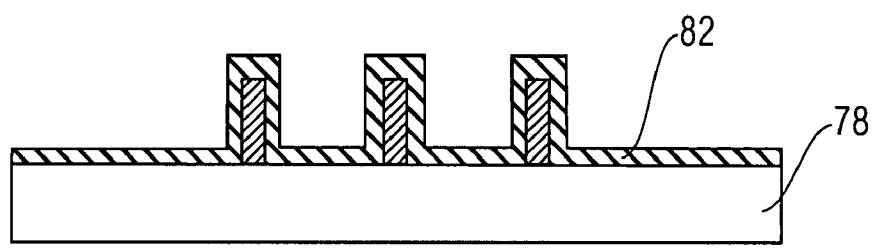

FIG 5c
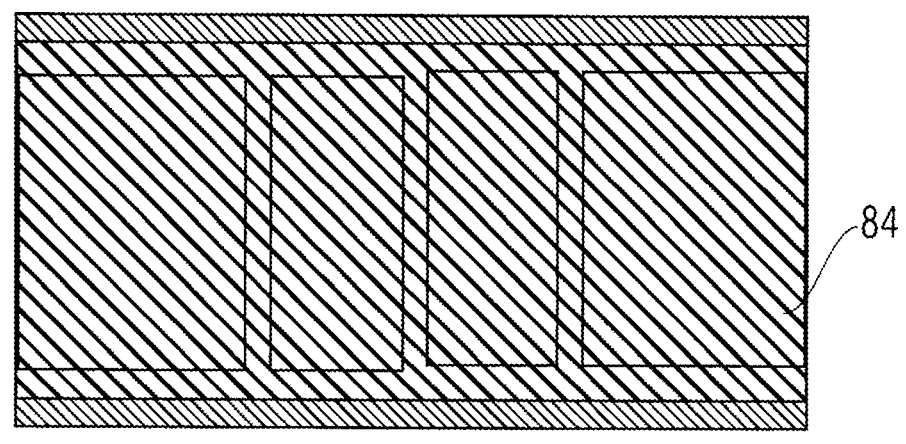
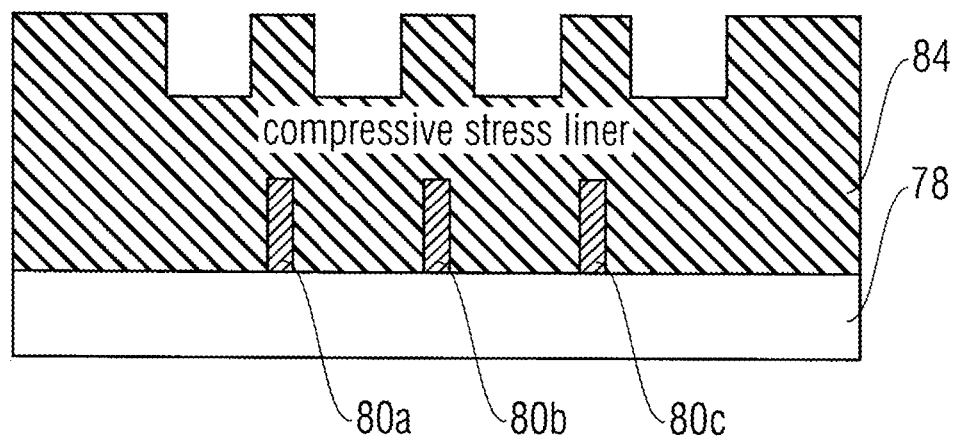

FIG 5g
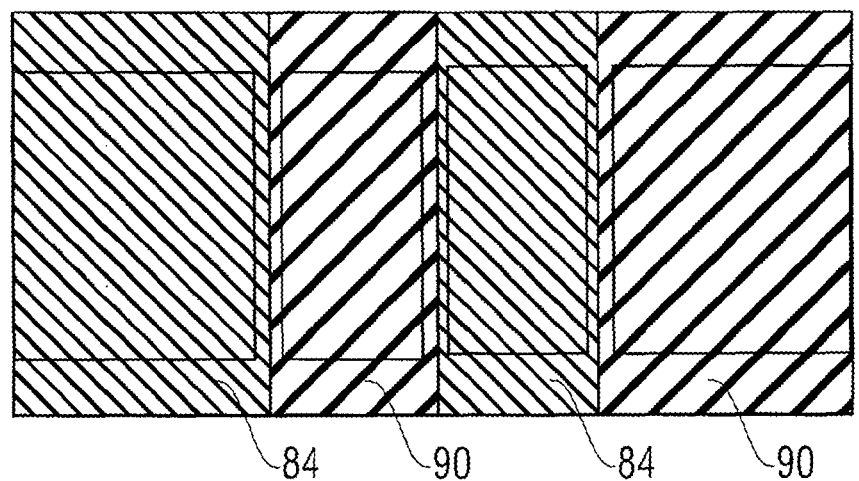
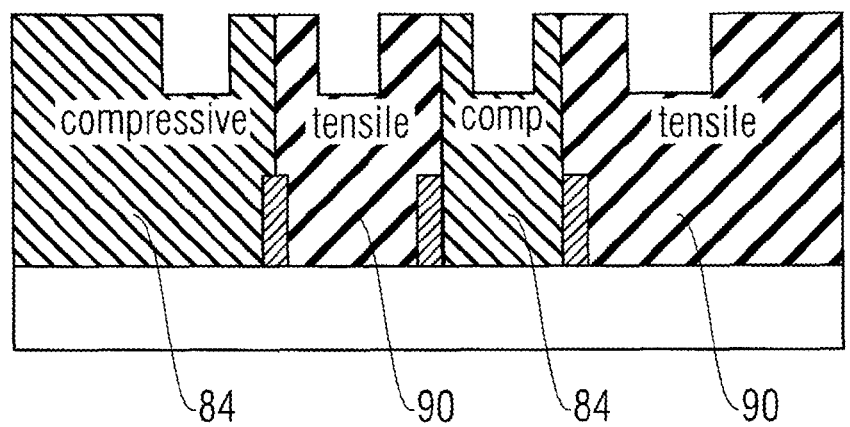

FIG 5h
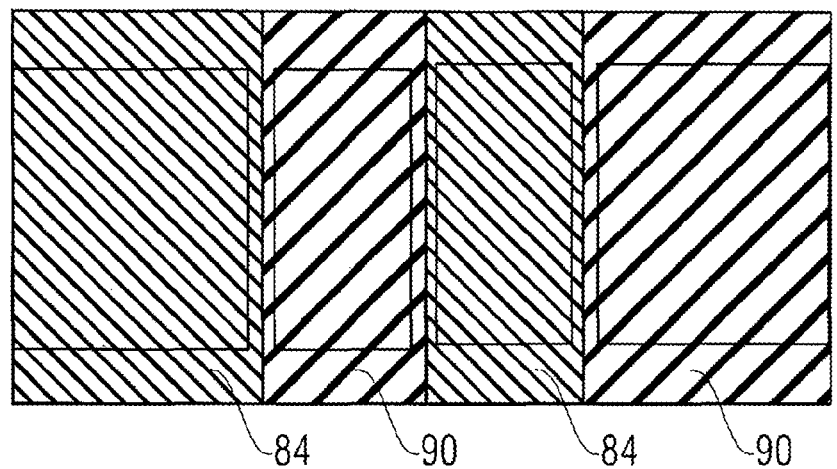
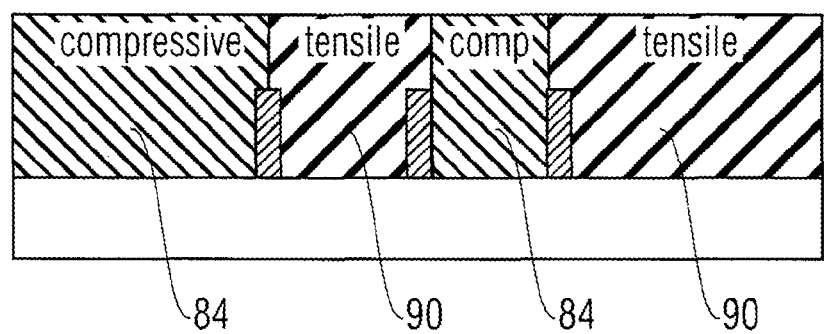

FIG 5j
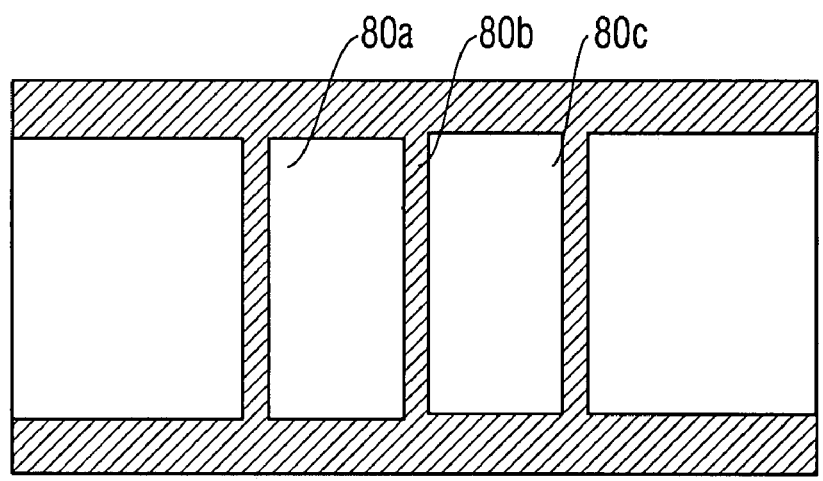
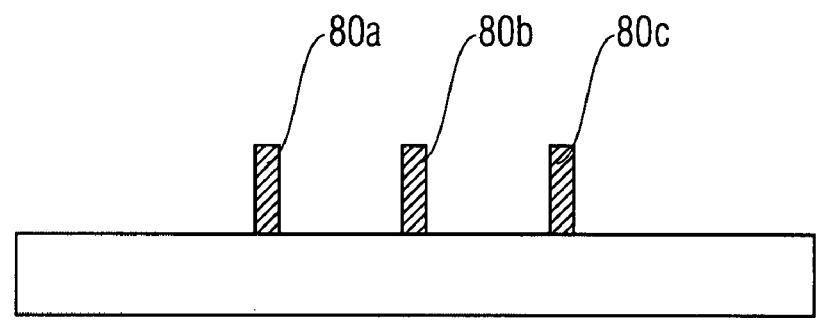

FIG 5m
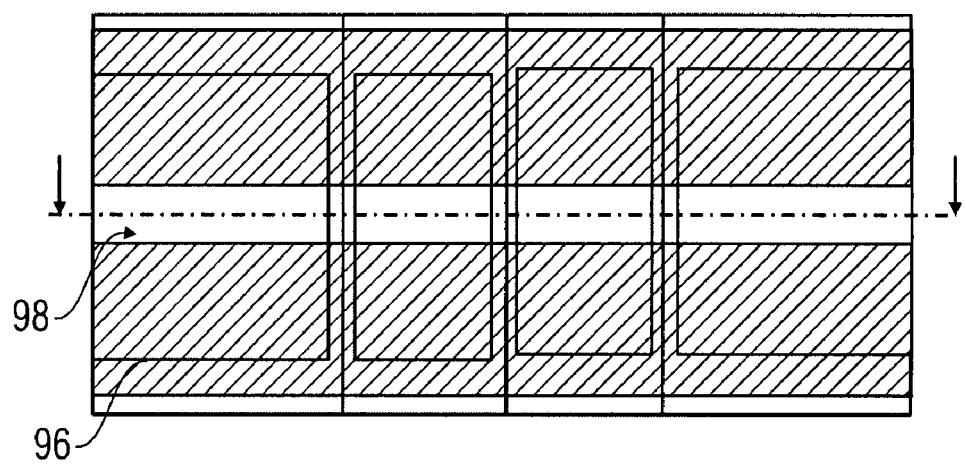
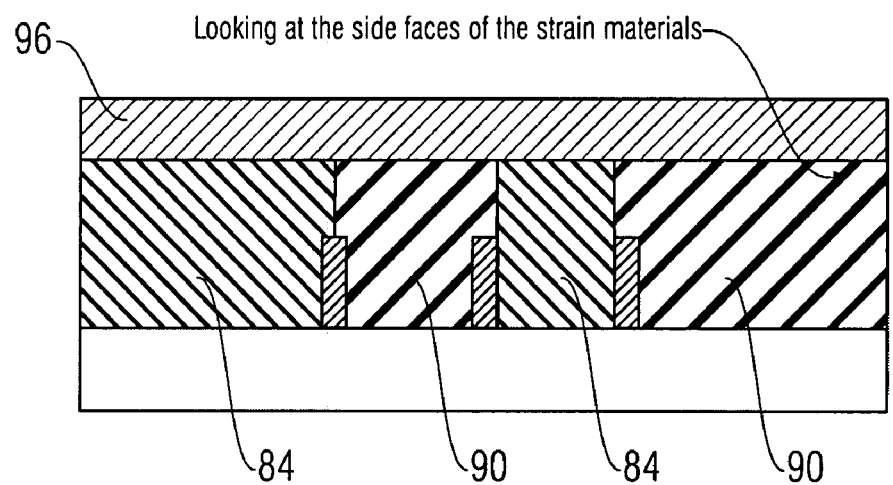

FIG 5n
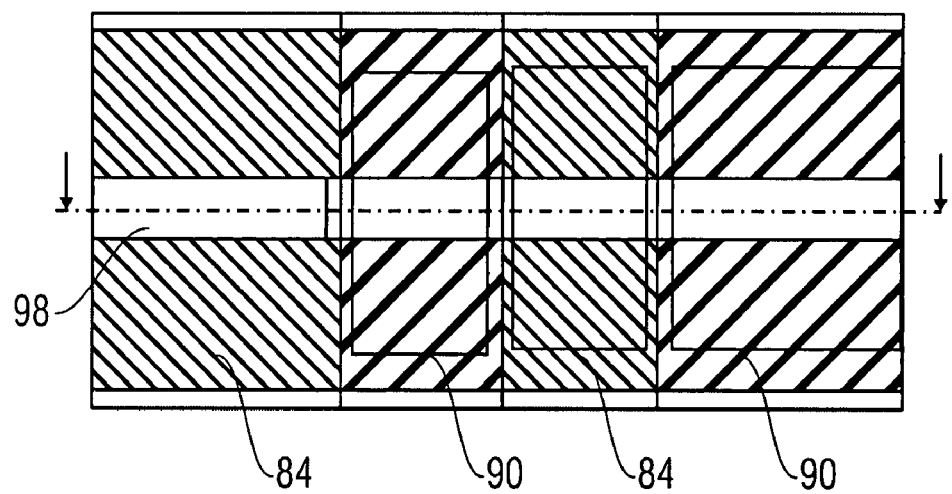
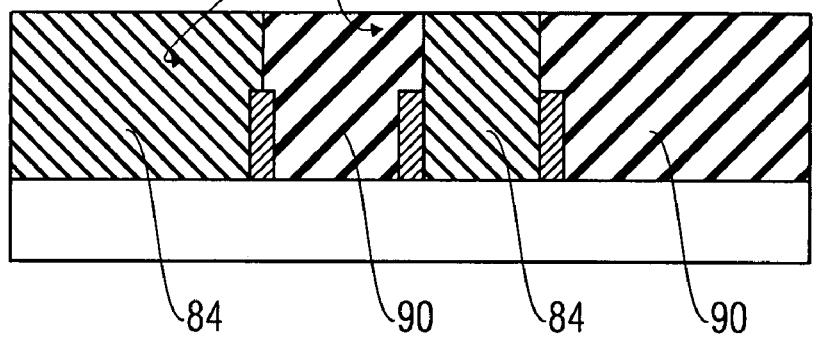
Looking at the side faces of the strain materials

FIG 5o
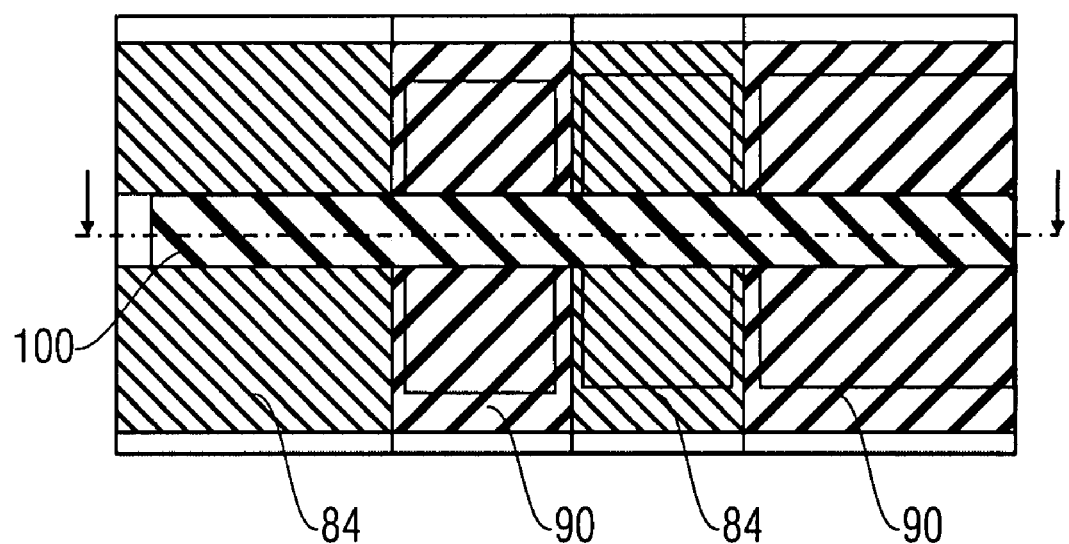
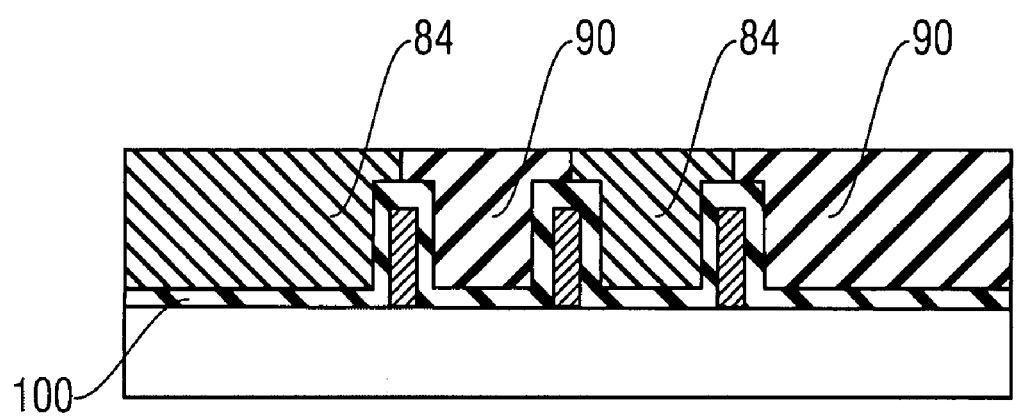

FIG 5p
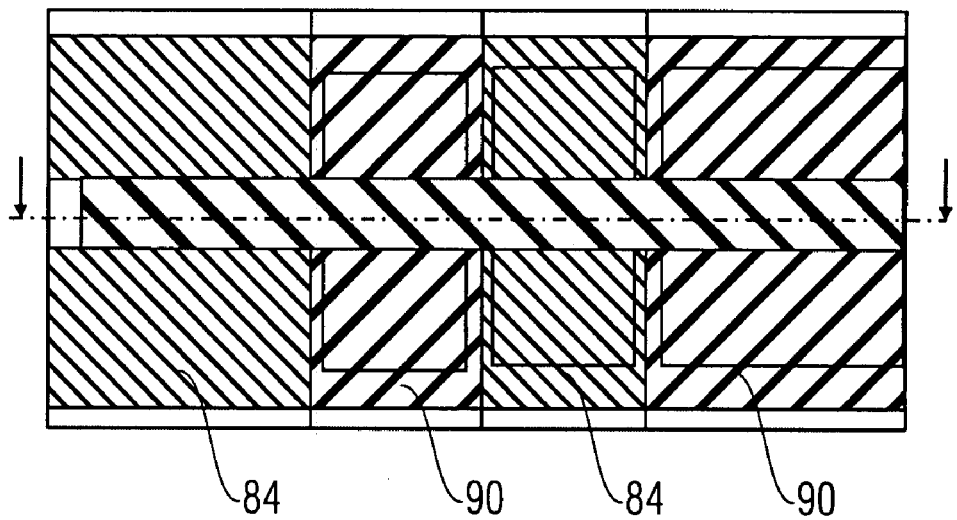
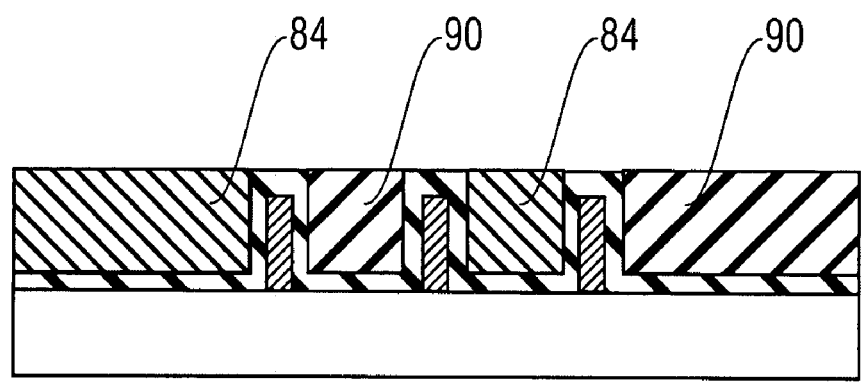

Bridge material a/ material b

Bridge material a/ material b

METHOD FOR FABRICATING A FIN-SHAPED SEMICONDUCTOR STRUCTURE AND A FIN-SHAPED SEMICONDUCTOR STRUCTURE

BACKGROUND

The present invention relates to fin-shaped semiconductor structures and a method for fabricating the same, and in particular to a concept as to how to enhance the electrical properties of fin-shaped semiconductor structures.

The demand for ever smaller semiconductor structures led to the development of three-dimensional structures, deviating from simple planar geometries, as for example, to the development of FinFET devices.

However, the smaller the geometry of the devices, the higher the current-densities as compared to conventional devices. Ongoing shrinkage of the structures in semiconductor processing also requires an enhancement of the conduction probabilities of the semiconductor materials used. One related technique is using so-called "strained-silicon," which is silicon with artificially increased or decreased lattice coefficients in the direction of the charge carrier transport, such that the carrier mobility increases. A device using such strained-silicon switches faster and is capable of transporting current at decreased conduction losses.

SUMMARY OF THE INVENTION

According to one embodiment of the present invention, a fin-shaped structure of a semiconductor material is used, which is under tensile stress along a longitudinal direction of the fin-shaped structure. The longitudinal direction is intended to be the direction of the charge transport. Therefore, the charge transport performance is increased within the fin-shaped structure, allowing the building of enhanced "three-dimensional" semiconductor devices.

According to a further embodiment of the present invention, a method for fabricating a fin-shaped semiconductor structure is provided. A fin-shaped structure is formed from a semiconductor material. The fin-shaped structure is processed to generate a tensile stress within the semiconductor material along a longitudinal direction of the fin. Therefore, when a charge transport takes place in the longitudinal direction, the transport capabilities of the fin-shaped structures are significantly enhanced, allowing the construction of more efficient devices.

BRIEF DESCRIPTION OF THE DRAWINGS

In the subsequent paragraphs, several embodiments of the present invention will be discussed, referencing the enclosed figures, wherein:

FIGS. 4a-4i show an embodiment of a method for fabricating a fin-shaped semiconductor structure;

FIGS. 5a-5h and 5j-5p show a further embodiment of a method for fabricating a fin-shaped semiconductor structure;

DETAILED DESCRIPTION OF ILLUSTRATIVE EMBODIMENTS

Figure 1:
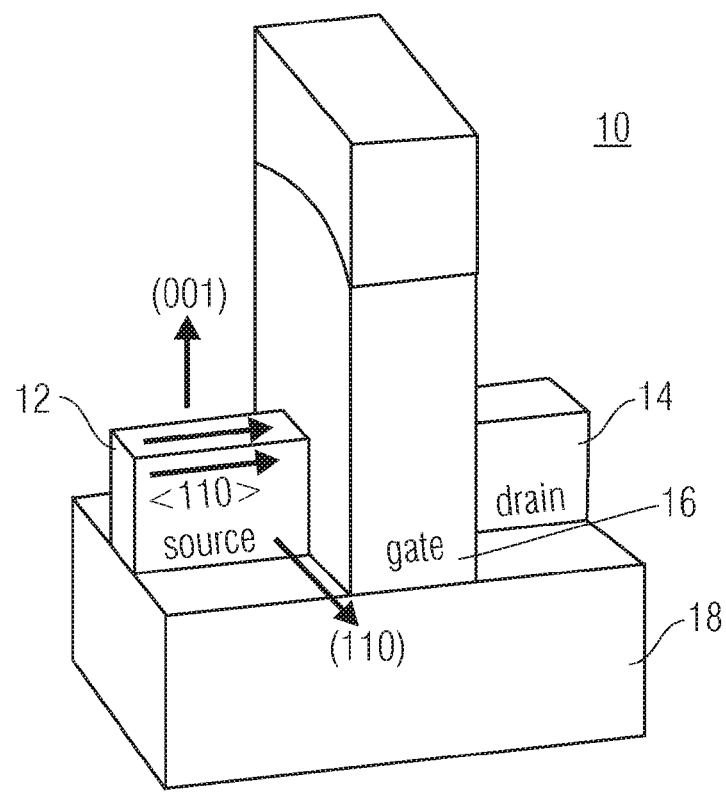
FIG. 1 shows an example of a FinFET.

Prior to a detailed discussion of several embodiments of the present invention, FinFETS implementing fin-shaped semiconductor structures are shortly reviewed referencing FIGS. 1 and 2, to provide a better understanding of the inventive concept, directed to the fabrication or use of fin-shaped semiconductor structures. It goes without saying that, although the invention will mainly be described by the creation of FinFETs within the following paragraphs, the invention may appropriately apply also to other semiconductor devices which require fin-shaped semiconductor structures or which may benefit from the application of fin-shaped semiconductor structures.

FIG. 1 shows a principle sketch of a FinFET device 10, having a source region 12, a drain region 14 and a gate region 16, which are built on a support substrate 18. Opposed to conventional FETs using planar geometries, FinFETs transport current from the source region 12 to the drain region 14 through a channel volume extending from the surface of a three-dimensional structure, which will hereinafter be referred to as a fin. The gate region 16 surrounds the fin at least partially, thus is capable of creating a channel underneath the gate, which has a significantly higher active volume than a channel of a conventional two-dimensional FET device. Therefore, transport characteristics of a FinFET are superior to those of a planar FET of comparable size. The rectangular prism forming the source 12, the drain 14 and the channel 16 regions underneath the gate and like structures are called fin-shaped structures throughout the present application.

It goes without saying that a fin-shaped structure is not necessarily rectangular, as in the specific example of FIG. 1. Any other geometry that forms a volume of semiconductor material extending in three dimensions can be used. To this end, a fin-shaped structure could be characterized as a three-dimensional semiconductor structure, having a longitudinal direction, which is the direction of the greatest dimension of the fin-shaped structure. One could also define the term "fin-shaped structure" as being a three-dimensional semiconductor structure having a direction of desired charge carrier transport, which is named the longitudinal direction.

Figure 2A:
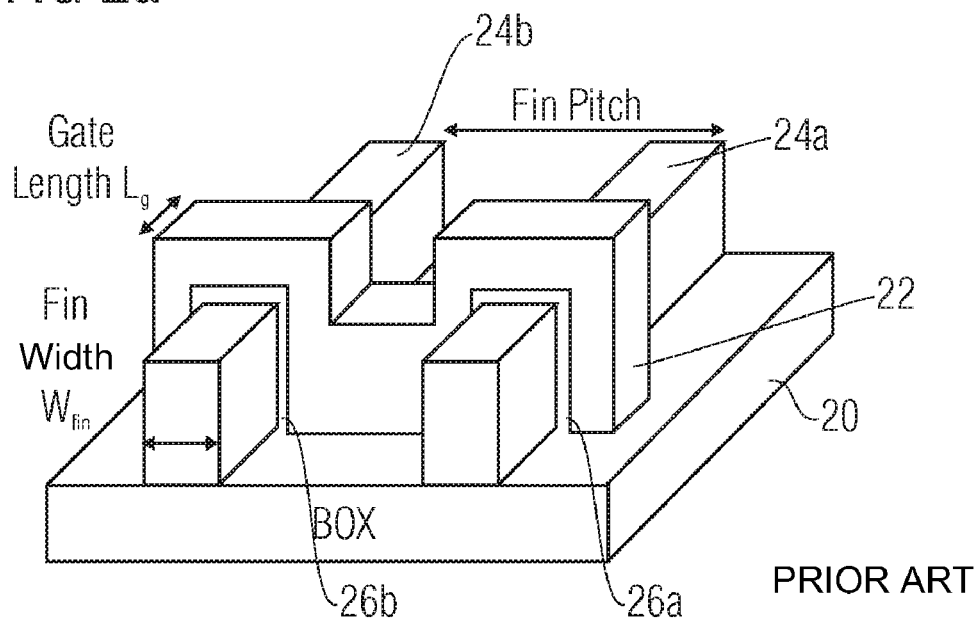
FIGS. 2a and 2b show an example of a multi-gate FinFET.
Figure 2B:
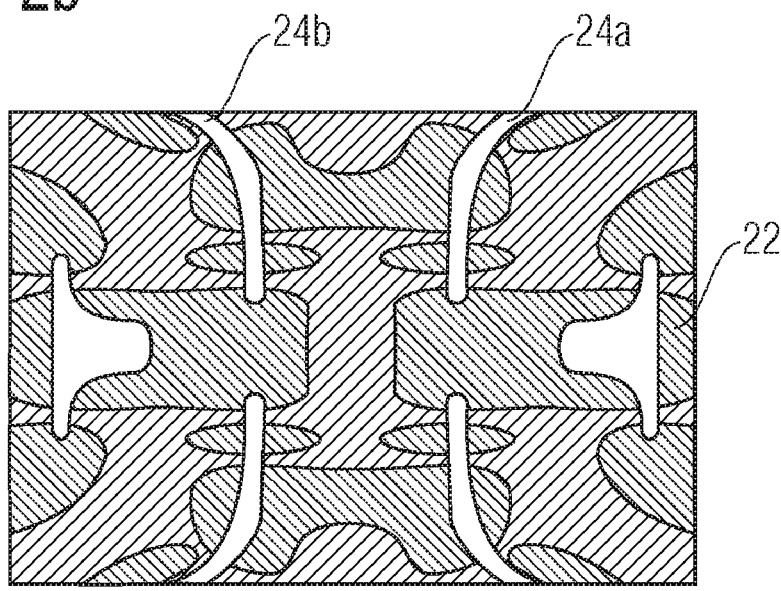

FIGS. 2a and 2b show further examples for FinFET structures that embody two fins, thus increasing the maximum current to be switched by the FinFET. The number of fins in principle can be extended to any number greater than two, so as to increase the maximum current to be switched as desired. The two-gate FinFET of FIG. 2a is built on a support substrate 20 which is, in this particular example, a buried oxide (BOX) of a silicon-on-insulator wafer. The FinFET has a common gate area 22, which partly covers the surface of the fins 24a and 24b used to transport the current (not shown). A channel is formed in the fins when an appropriate voltage is applied to the gate area 22. As is commonly known, the gate area 22 has to be electrically isolated from the fins 24a and 24b, which is achieved by thin insulation layers 26a and 26b between the fins 24a and 24b and the gate area 22. When multi-gate fins are used, one may adjust the fin pitch, which is the spacing by which neighboring fins are separated. The fin-width $W_{fin}$ is the lateral extension of the fin in the direction of the fin pitch, as illustrated in FIG. 2a. The fin-height (not shown) is the height the fin-shaped structure extends from the support substrate 20. The fin-height and fin-width directly impact the volume of the channel area in the fin and can, therefore, be designed to meet the desired properties of the device.

FIG. 2b is a two-dimensional image of the multi-gate Fin-FET (MuGFET), taken by a microscope in a direction perpendicular to the surface of the support substrate 20. Naturally, identical elements of FIGS. 2a and 2b have the same reference numerals and their description and the description of their functionality may, likewise, be used in FIG. 2a and in FIG. 2b.

As the preceding examples of FinFET devices have shown, the creation of fin-shaped structures leads to a new generation of devices with superior properties. It is again emphasized that the precise geometry of a fin-shaped structure is not important to achieve the aforementioned benefits. A fin-shaped structure in the context of this application may also be shaped differently. For example, a cylindrical geometry or any other three-dimensional geometry extending in a longitudinal direction may be used.

Figure 3A:
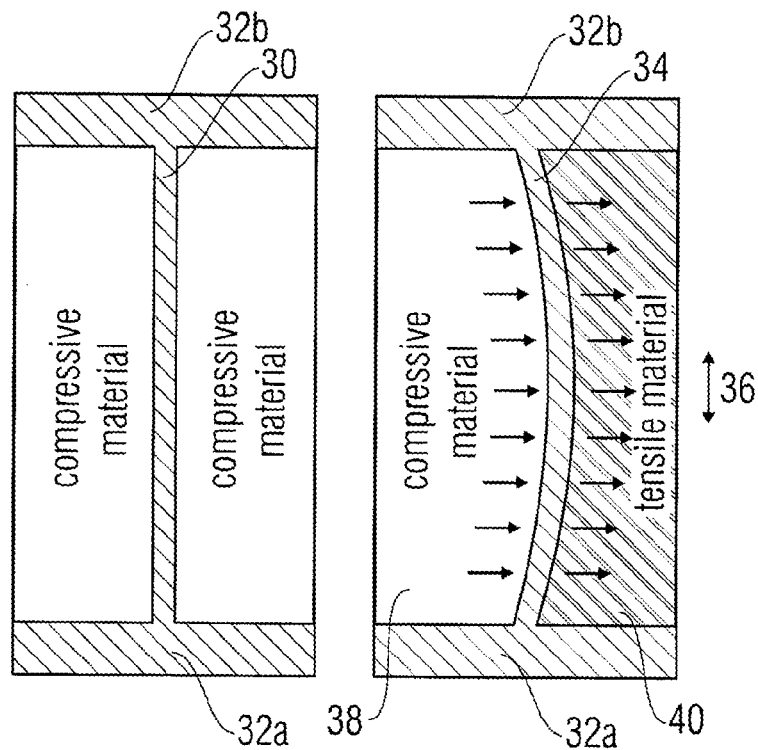
FIGS. 3a and 3b show an embodiment of the present invention.
Figure 3B:
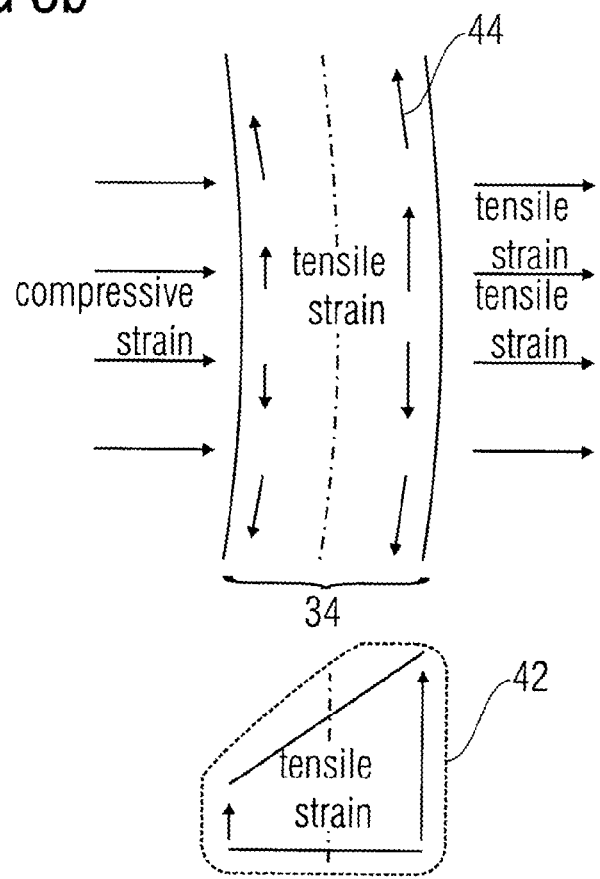

FIGS. 3a and 3b show an embodiment of the present invention having a fin-shaped structure of a semiconductor material that is under tensile strain along a longitudinal direction 36 of the fin-shaped structure. As shown in FIG. 3a, a fin-shaped structure 30 extends from a first semiconductor region 32a to a second semiconductor region 32b. According to an embodiment of the invention, the fin-shaped structure 34 is processed such that a tensile strain is created within the semiconductor material along the longitudinal direction 36 of the fin-shaped structure 34. In the particular example of FIG. 3a, the tensile strain is generated by the application of compressive material 38 on one side of the fin and by the simultaneous application of tensile material 40 on the other side of the fin-shaped structure 34, which is opposite to the first side. In other words, compressive material 38 is applied to a first side face of the fin-shaped structure 34, which is perpendicular to the longitudinal direction 36. Simultaneously, tensile material 40 is applied to a second side face of the fin-shaped semiconductor structure 34, which is opposite to the first side face. As indicated in FIG. 3a, the application of different forces to opposite side faces of the fin-shaped structure results in a deflection of the fin-shaped structure 34, thereby creating a tensile strain within the semiconductor material of the fin, as indicated in FIG. 3b.

FIG. 3b illustrates schematically the force on the semiconductor structure. The fin-shaped structure 34 is deflected by the simultaneous application of compressive strain and tensile strain as described in the preceding paragraphs. Therefore, tensile strain is created in the longitudinal direction 36 within the fin-shaped structure 34. According to the geometry of the fin, a tensile strain profile is created within the fin, as indicated by the schematic strain-profile 42, showing the absolute value of the tensile strain along the cross-section of the fin in arbitrary units. The tensile strain in the longitudinal direction 36 of the fin is illustrated by arrows 44, illustrating that the strain is applied in the longitudinal direction 36 of the fin-shaped structure 34. Therefore, the carrier mobility is increased in this direction, such that a current flow through the fin-shaped structure 34 is enhanced when compared to a fin-shaped structure without tensile strain in the longitudinal direction 36, i.e., with the fin-shaped structure 30 before the deflection.

As will be shown in the following description of embodiments of the present invention, which details methods for fabricating a fin-shaped structure, the compressive and/or tensile materials do not necessarily have to remain in place. For example, the compressive stress and tensile stress may be applied to a fin fabricated of amorphous material. When the material is re-crystallized after the application of the stress (e.g., by thermal treatment) the strain created will remain within the crystal structure even if the compressive and tensile materials are removed. It goes without saying that it is not vital to apply compressive as well as tensile material on either side of the fin.

In further embodiments, only compressive or tensile material may be used, which is applied only to one side face of the fin. In other embodiments, the stress may be applied using other techniques such as, for example, by removing part of the support substrate 20 of FIG. 2a underneath the fins 24a and 24b. As a consequence, the stress unavoidably put on the fins by the gate material will bend the fins and, therefore, deflect them from their original position, thus generating tensile strain within the fin.

Mechanical deformation of the fin can furthermore be achieved by attaching bridges of expansive or contractive material to the side faces of the fin, which can, for example, be activated by thermal treatment, irradiation, ion bombardment or by a chemical reaction. That is, for example, dielectrics having different thermal expansion properties may be used and attached to the side faces of the fin. When heating or cooling the bridges, the deflection may be caused due to the expansion or contraction of the bridges, which may be irreversible or reversible.

Generally, several embodiments of the invention increase FinFET device performance (specifically n-FET) by introducing tensile strain inside the fins or the fin of a gate-structure (for example, also within multi-gate fins). This increases the electron mobility and, therefore, enhances the n-FET performance. As previously discussed, some embodiments use alternating tensile and compressive films to deform (bend and strain) fins or fin-shaped structures (for example, of a FinFET) to create tensile strain inside the fin. This will increase electron mobility and enhance device performance.

The above discussion on the benefit of tensile strain in the longitudinal (channel) direction on electron mobility is referencing a crystal orientation of a silicon fin as shown in FIG. 1 wherein the fin is formed on top of a substrate with a (001) surface orientation and a longitudinal direction of <110>. It is conceivable that the method of creating longitudinal strain is also beneficial for the electron mobility for other fin orientations and materials. It is further conceivable that for certain fin orientations, longitudinal tensile fin strain may be beneficial for hole mobilities.

FIGS. 4a-4i show an embodiment of a method for fabricating a fin-shaped semiconductor structure for a FinFET device.

Figure 4A:
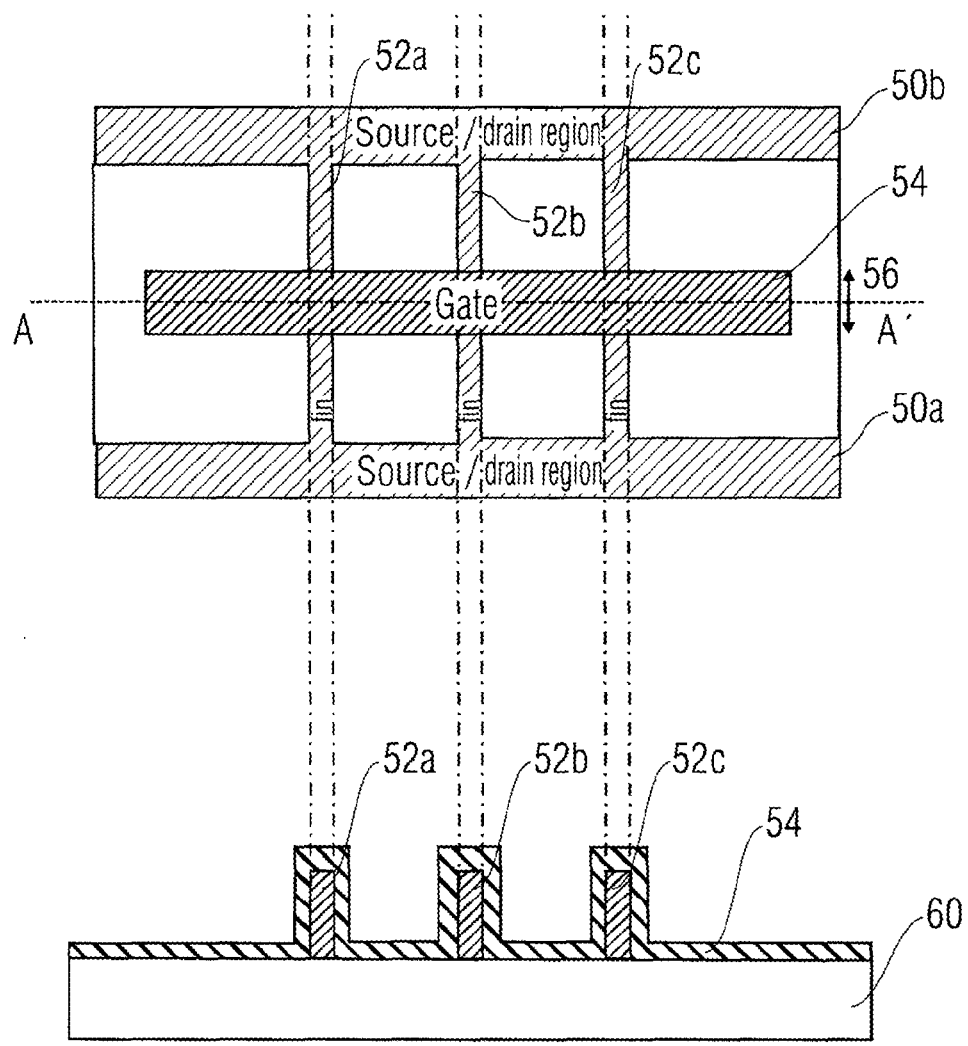

As only the important steps are described, the description of the method starts from a configuration, wherein source/drain regions 50a and 50b are already structured, which are interconnected by fin-shaped structures 52a-52c. In the configuration of FIG. 4a, a gate region 54 is already created, which runs in a direction perpendicular to the longitudinal direction 56 of the fin-shaped structure and which covers parts of the surface of the fin-shaped structures 52a-52c. It may be noted that in FIG. 4a and also in the following figures, the semiconductor structure is shown in two views, the first view being a face-on view in the direction of the surface, the second being a cross-section of the semiconductor structure, across the line A-A'. The whole device is built upon a substrate 60 which can, for example, be an isolating substrate (BOX) of a silicon-on-insulator wafer or the like. Alternatively, the structure could for example be built on top of a conventional semiconductor wafer.

FIG. 4b illustrates the next step of the method, in which a layer of compressive materials 64 is applied to the surface of the device, such that the structures are fully covered by a thin film of compressive material. For the sake of simplicity, some of the reference numerals introduced in the preceding drawings are omitted when detailing the next production steps, so as to not overload the images but rather to focus on the individual production steps.

FIG. 4c shows an alternative procedure to FIG. 4b, wherein a thick layer of compressive material 64 is coated on the surface of the substrate 60.

Figure 4D:
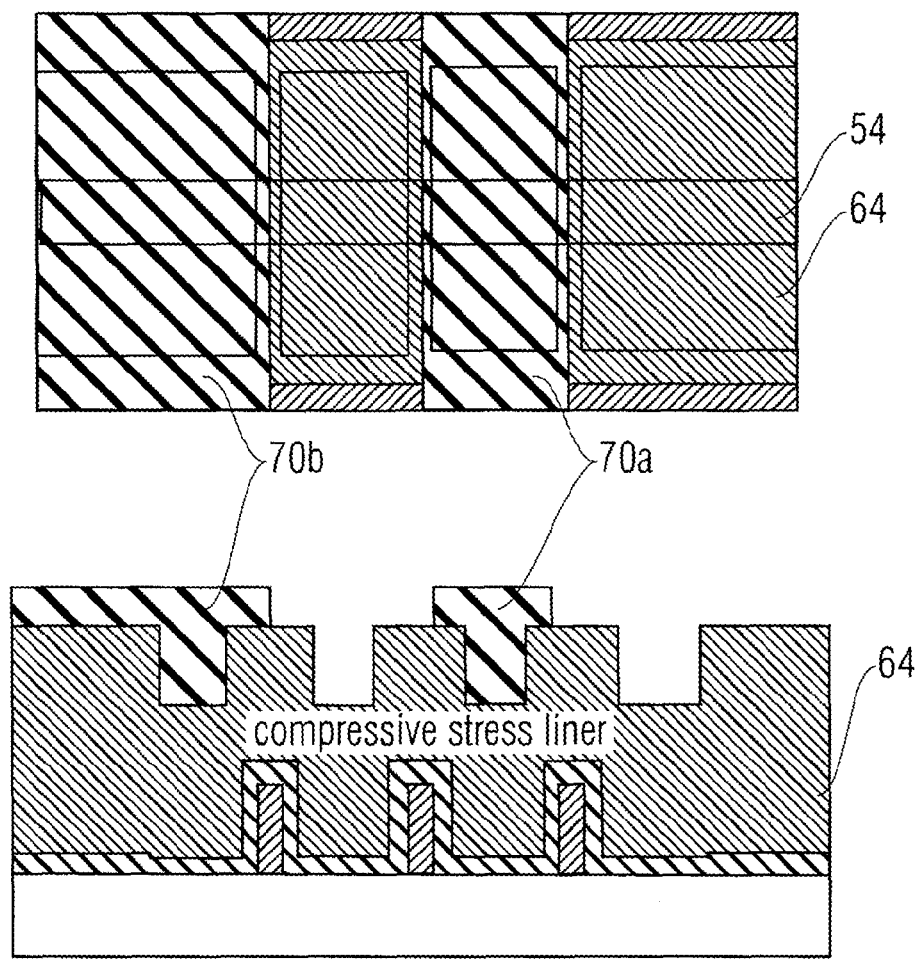

In the next step, illustrated in FIG. 4d, masks 70a and 70b are applied on the surface of the compressive material 64 at those positions where the compressive characteristic of the compressive material 64 shall be preserved. As will be described below, the compressive characteristic of the compressive material 64 can be changed by treating the compressive material 64 in an appropriate manner.

In that sense, the term "compressive material" may be understood as describing material that has in principle the capability of applying force to the fin-shaped structures, for example, when the material increases its volume when heated up or cooled down. On the other hand, in the configuration of FIG. 4d, the fins are completely surrounded by the compressive material 64. In this configuration, even a heating or a volume change of the compressive material 64 would not apply a deflective force to the fin-shaped structures as the force would be applied with the same strength from all directions.

Figure 4E:
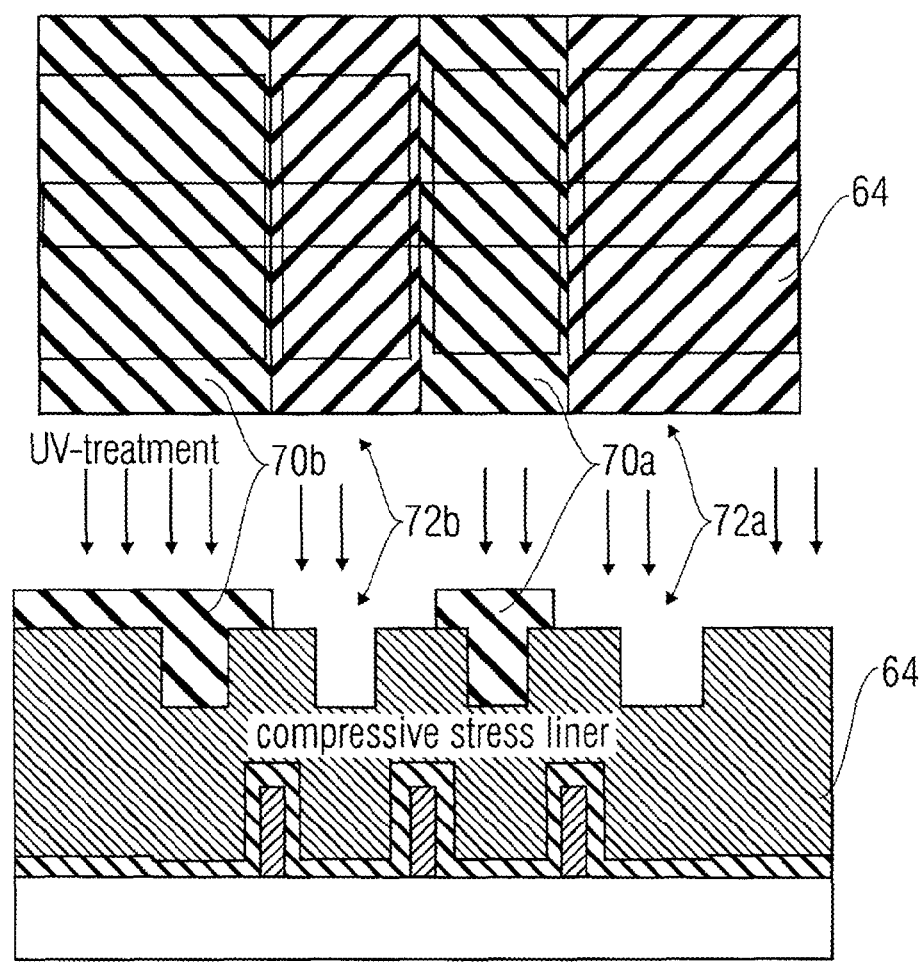

As shown in FIG. 4e, to provide a deflective force, i.e., an overall force in one direction, the device is subject to a special treatment (for example, UV treatment, laser treatment) which only affects the un-masked areas 72a and 72b, as the remaining areas are shielded by the masks 70a and 70b. When the compressive material 64 is chosen properly, UV treatment converts the compressive material 64 into tensile material, for example, by removing solvents of an organic material, such that the volume of the material decreases. Laser treatment could be used in combination with a mask that reflects the laser energy from the masked areas. The thermal energy that is absorbed by the unmasked areas will change the compressive material to tensile material. Using well focused laser beams, a maskless approach is also feasible, in which the laser irradiates only the areas to be transformed.

Figure 4F:
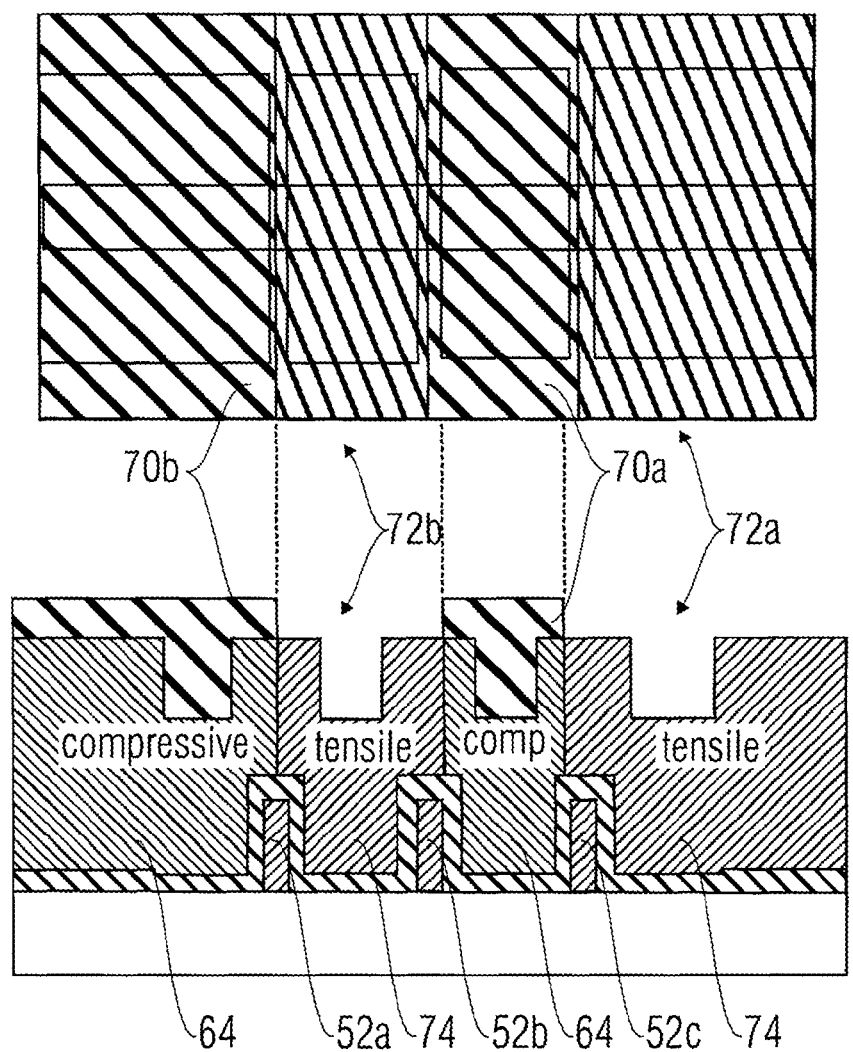

As can be seen in FIG. 4f, the un-masked areas 72a and 72b or, to be more precise, the material below the un-masked areas 72a and 72b has changed from having compressive to having tensile characteristics. As such, compressive material 64 alternates with tensile material 74 after the irradiation or UV treatment. As the borders of the masks 70a and 70b have been chosen to fall on top of the fin-shaped structures 52a-52c, each fin is, with a first surface, neighboring compressive material 64 and, with a second surface opposite to the first surface, neighboring tensile material 74. Therefore, a deflective force is applied to the fin-structure, which deflects the structure from its original position, as indicated in FIGS. 3a and 3b. That is, a tensile strain along the longitudinal direction 56 of the fins is generated, resulting in a fin-shaped semiconductor structure with enhanced conduction characteristics and, therefore, in a FinFET device with improved characteristics.

Figure 4I:
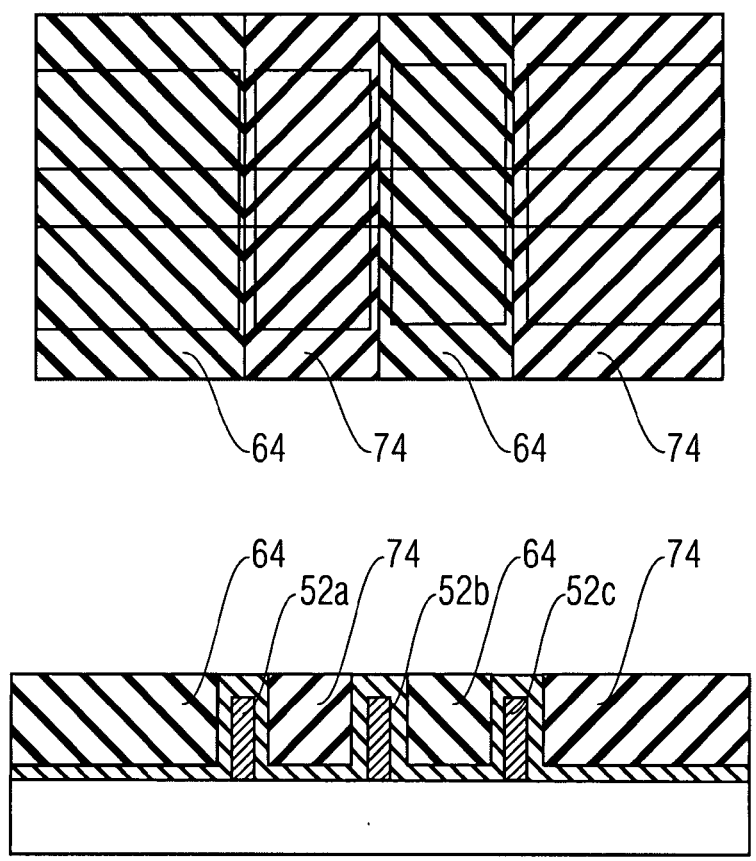

FIGS. 4g-4i show further production steps for creating a fully functional FinFET. FIG. 4g shows the configuration of 4f after the masked material has been removed, such that further processing can take place, e.g., for contacting the gate structures or the gate areas.

Again, it is important to note that the fin structures are deflected from their no-stress positions in the configuration of FIG. 4g.

A first alternative for the further processing and the provision of appropriately strained fin-shaped structures is shown in FIG. 4h, wherein the compressive material 64 and tensile material 74 are fully removed prior to the further processing of the device. The fins would normally return to their original non-strained state when the tensile and compressive materials 74 and 64 are removed. Further pre- and post-processing steps are therefore necessary when the alternative of FIG. 4h is chosen. This comes with the benefit that the device of FIG. 4h can be introduced in already existing production steps, since the configuration does not differ from normal FinFET intermediate configurations, except that the fin-shaped structures comprise semiconductor material being strained in the longitudinal direction. However, to avoid the return of the fin-structures to their original configuration, the semiconductor material has to be transformed or provided in its amorphous state prior to the application of the compressive and tensile forces or it has to be treated to become amorphous while the compressive and tensile forces are still applied to the fins.

When the fins are still subject to the deflective force, the semiconductor material of the fins is re-crystallized, since the strain will remain in the semiconductor material when it is retransformed into a mono-crystalline state. Once the re-crystallization has taken place, the compressive and tensile materials 64 and 74 can be removed, resulting in the configuration of FIG. 4h with the semiconductor fins subjected to the tensile strain as desired.

FIG. 4i illustrates a further possible configuration, which is created started from the configuration of FIG. 4f. As can be seen in FIG. 4i, the compressive and tensile materials 64 and 74 are planarized, so as to remain on the surface of the substrate 60 and between the fin-shaped structures 52a-52c. Therefore, the deflective force at the side faces of the fin-shaped structures 52a and 52c will remain unchanged and an amorphization and re-crystallization of the semiconductor material of the fins is not necessary.

Summarizing the above, one embodiment of the invention uses alternating tensile and compressive films to deform (bend and strain) fins (e.g., of a FinFET) to create tensile strain inside the fin (in its longitudinal direction). This increases electron mobility and enhances device performance. To create alternating tensile and compressive films, only compressive films are initially deposited and, in some areas, are treated to convert the compressive stress in the films into tensile stress. This can be done, e.g., by masking the areas in which the stress is to remain compressive and then exposing the wafer to a heat treatment (e.g., UV irradiation) or by using a laser anneal with a laser wavelength that is deflected or absorbed by the mask. In a mask-less approach, the laser is able to scan and treat only those areas that need to be transformed. The tensile and compressive liners or films could remain in place permanently, or a strain memorization technique could be used, in which the fins are first amorphized, then the strained materials are applied, the fins are re-crystallized and, finally, the strained materials are removed. The fins will retain the internal strain without the presence of the strained materials.

As far as the compressive and tensile materials are concerned, any sort of material may be used that acts or can be made to act such that it applies force on the sidewalls of the fin-shaped structures. The underlying physical mechanism could be, for example, thermal expansion or compression, could, for example, decrease or increase the volume due to a phase-transition or change in molecular bonding or crystal lattice constant of the material, or could be any other mechanism that is suited to apply force to a given surface. It is conceivable that a volume change can be induced by ion implantation followed by an optional thermal treatment.

The conversion from compressive to tensile characteristics or vice versa can be based on any appropriate effect, such as a phase transition, modification of molecular bonds, or a volume increase or decrease, which may be thermally induced or induced by solving components of a formally crystalline material in a solvent such that the lattice of the remaining material changes, wherein the volume change creates a force on the sidewalls. Generally, the underlying mechanism could be physical, chemical or even mechanical.

Figure 5D:
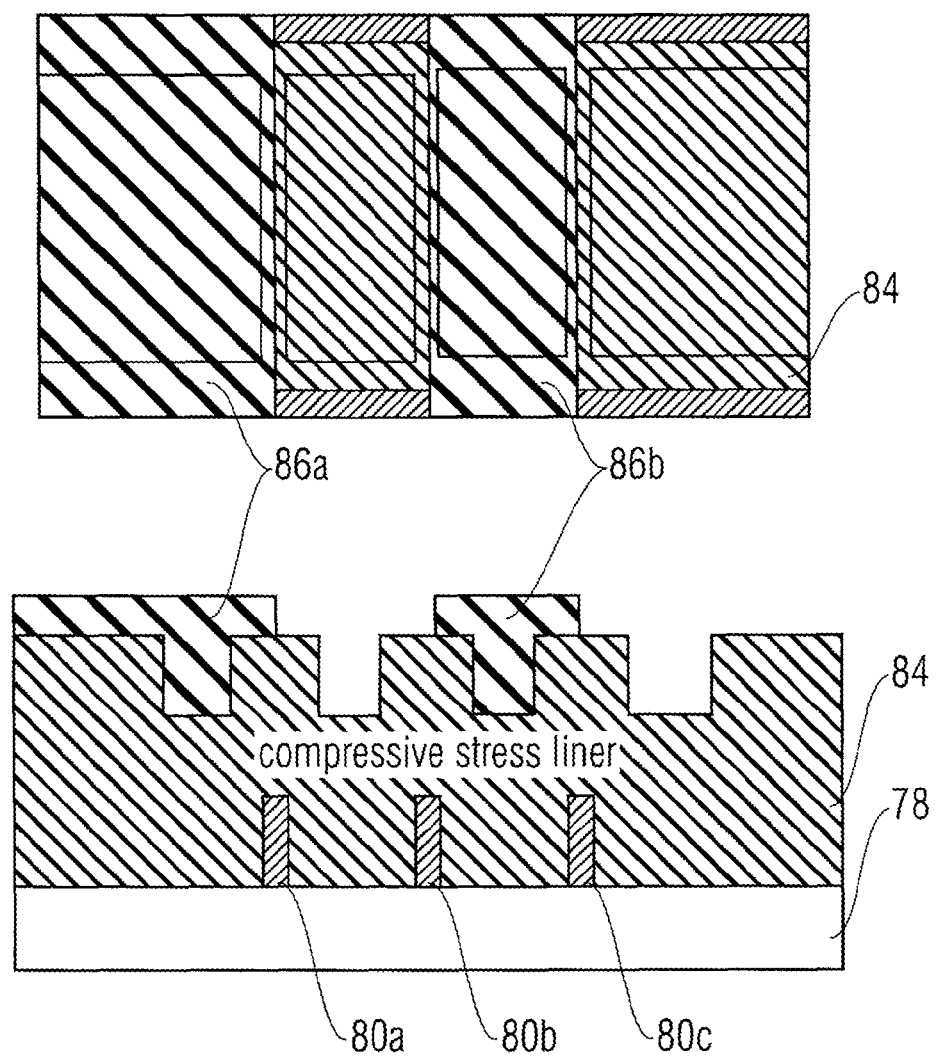

FIGS. 5a-5h and 5j-5p show a further embodiment of a method for fabricating a fin-shaped semiconductor structure within a FinFET device. The method starts from a configuration, wherein fins 80a-80c are already created but gate structures or gate regions are still missing. As in the previous embodiment, a first alternative is to put a thin layer of compressive material 82 on top of the substrate 78, as illustrated in FIG. 5b. In an alternative proceeding, which is illustrated in FIG. 5c, a thick layer of compressive material 84 is applied on the surface of the substrate 78, such that the fin-shaped structures 80a-80c are completely buried. As in the previous embodiment, the areas which are to be transformed into tensile material are covered by masks 86a and 86b, as illustrated in FIG. 5d.

Figure 5E:
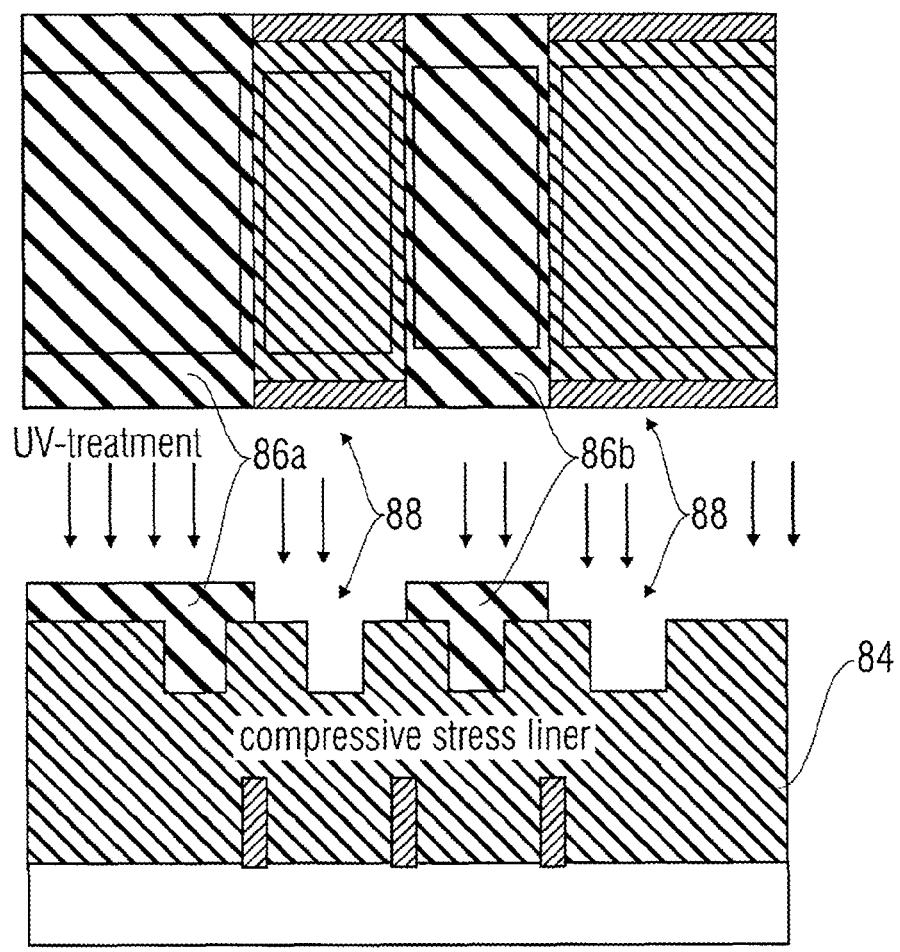
Figure 5F:
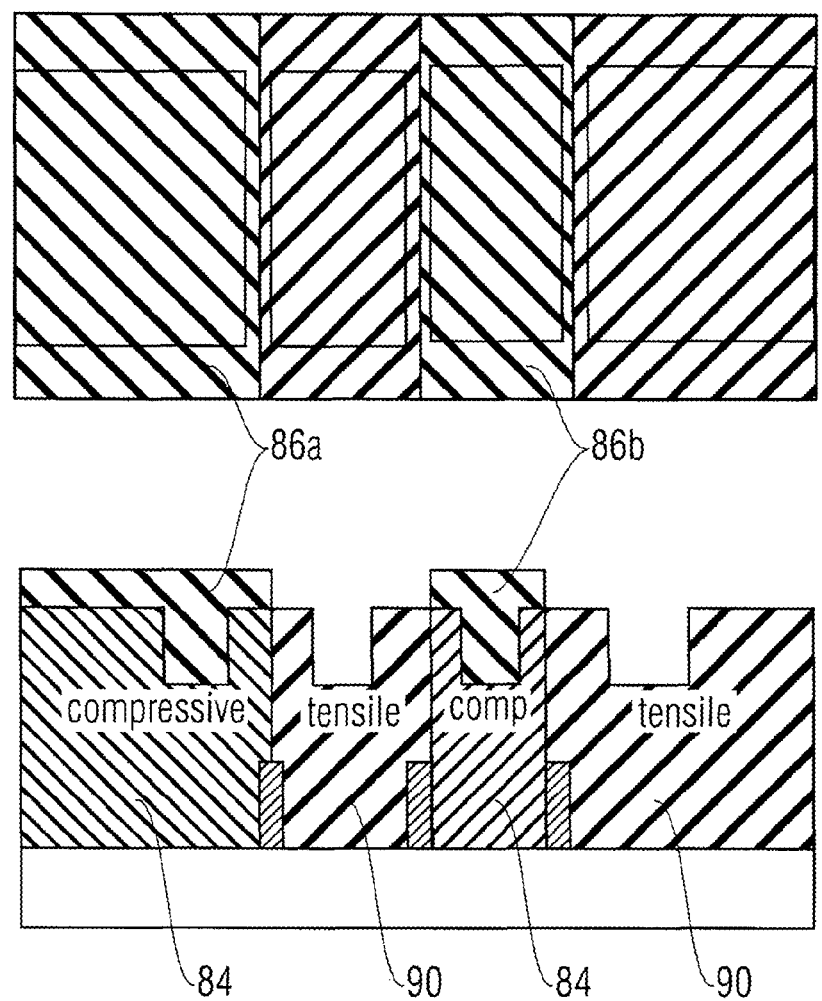

As shown in FIG. 5e, compressive material 84 underneath regions 88 not covered by masks 86a and 86b is converted into tensile material 90 (e.g., by UV treatment, see FIG. 5e), such that the configuration being characterized by alternating compressive material 84 and tensile material 90 is created, as illustrated in FIG. 5f. FIGS. 5g and 5h show two alternative configurations after the next process step, in which the masks 86a and 86b are completely removed. The configuration of FIG. 5h differs from the configuration of FIG. 5g in that the surface of the compressive and tensile materials 84 and 90 is planarized, such as to allow for more precise subsequent processing of the device.

Starting from the configurations of FIG. 5f, 5g or 5h, one possible alternative for the further processing is to completely remove the tensile and compressive materials 90 and 84, as shown in FIG. 5j, so as to arrive at a situation from which the previous processing has started. The difference, however, is that the semiconductor material within the fin-shaped structures 80a-80c is strained, such that the carrier mobility is increased. To this end, a re-crystallization of formally amorphous semiconductor material is required, as detailed in the previous paragraphs. Resulting in the configuration of FIG. 5j, normal gate processing, as conventionally known, may be performed to finalize a FinFET device.

Figure 5K:
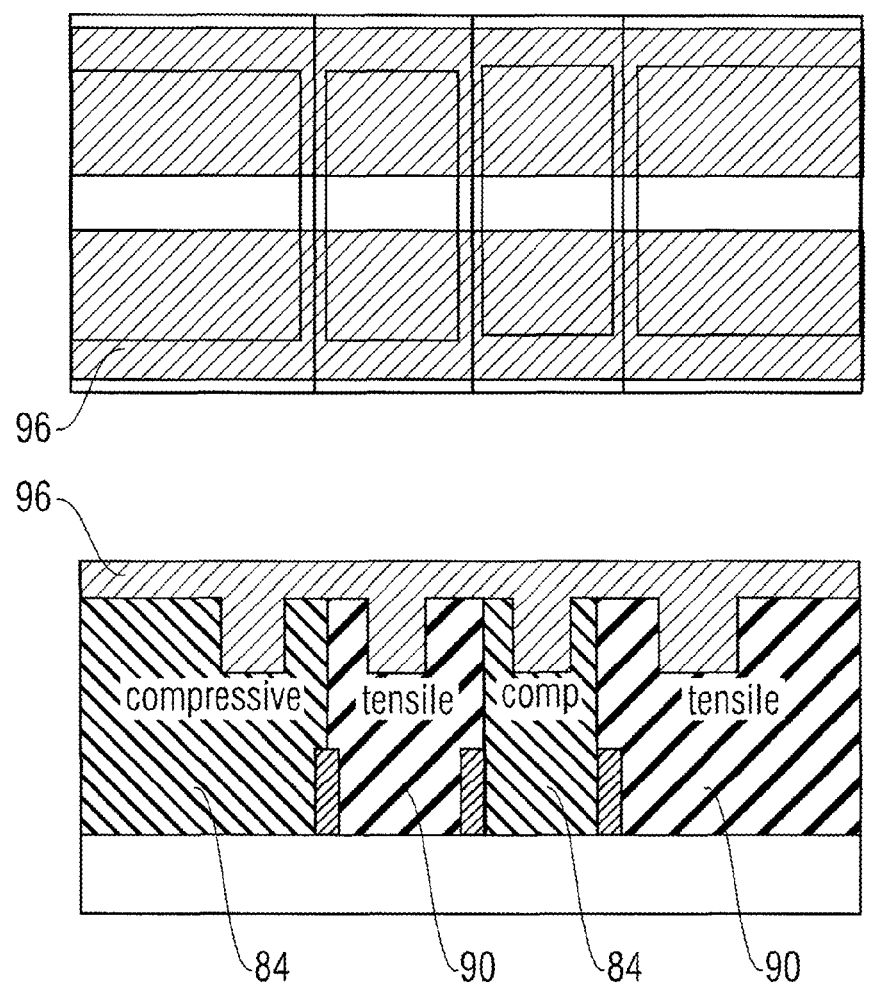
Figure 51:
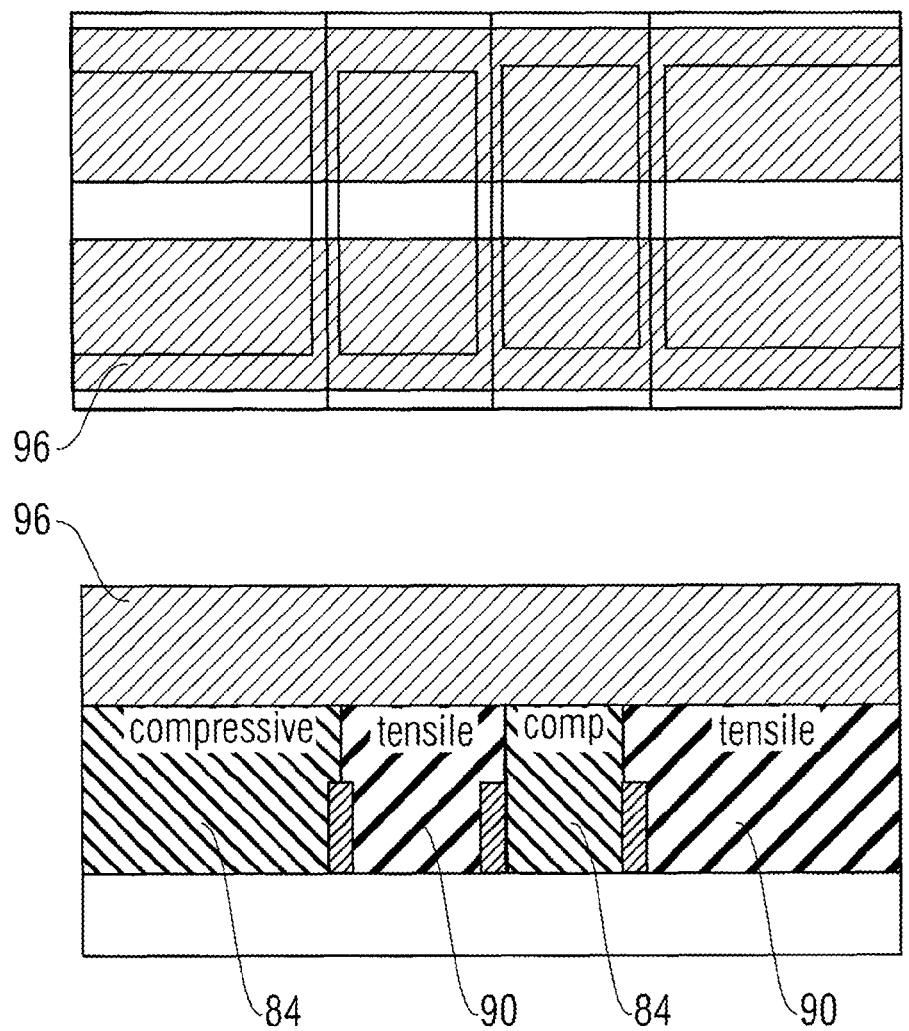

FIGS. 5k and 5l show the provision of a gate-mask on top of the configurations of FIGS. 5g and 5h, to allow for the subsequent generation of a gate-electrode, wherein the alternating compressive and tensile material layers 84 and 90 remain within the device, i.e., the FinFET to be fabricated. Therefore, a mask 96 is applied to the surface of the structure, wherein the areas where the gate-region shall be created remain unmasked, such that a subsequent etching results in the configuration shown in FIG. 5m, wherein a gate area 98 is created, which is free of tensile or compressive material. In FIG. 5n, the mask 96 is removed, such that tensile and compressive materials 90 and 84 reside on opposite sides of the fin-shaped structures 80a-80c, whereas the gate area 98 is freed from the tensile or compressive materials 90 and 84 and, therefore, is ready for the application of a gate electrode.

As shown in FIG. 5o, a gate dielectric and electrode 100 may be applied within the gate area 98 and, as illustrated in FIG. 5p, the recess of the tensile and compressive materials 90 and 84 may be planarized for the further processing of the FinFET structure of FIG. 5p. Alternatively, the mask 96 could be removed and the areas of compressive and tensile materials 84 and 90 could be planarized prior to the gate formation. Thus, the method illustrated in FIGS. 5a-5h and 5j-5p serves to create a FinFET with fins from a semiconductor with a tensile strain along the longitudinal direction, i.e., along the direction of the charge transport. Implementing the inventive methods, complicated three-dimensional semiconductor structures can be created, which additionally benefit from the use of strained silicon or strained semiconductor material.

It is further conceivable that a dummy gate is formed prior to the formation of the compressive and tensile areas. Once these areas are formed, the dummy gate could be removed and replaced by a permanent gate structure.

Figure 6A:
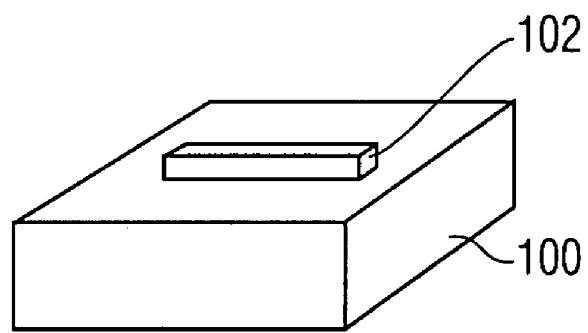
FIGS. 6a and 6b illustrate a further embodiment of a method for fabricating a fin-shaped semiconductor structure with internal tensile strain.
Figure 6B:
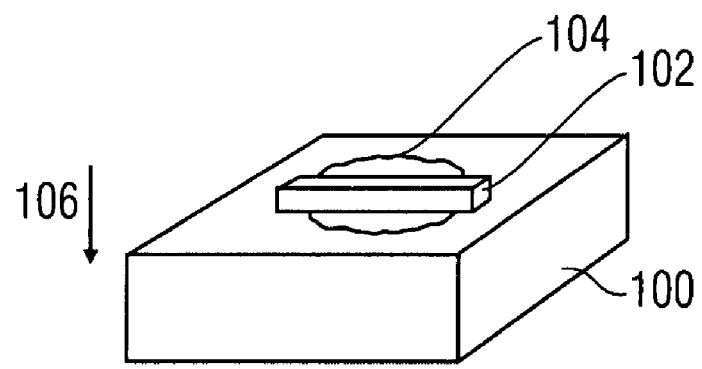

FIGS. 6a and 6b illustrate a further embodiment of a method for fabricating a fin-shaped semiconductor structure with internal tensile strain.

FIG. 6a shows schematically a body-material or support substrate 100, which is used to grow or create a fin-shaped semiconductor structure 102 on top of the support substrate 100. Tensile stress may be applied to the fin-shaped structure 102 by removing (for example by etching) portions of the support structure 100 directly supporting the fin-shaped semiconductor structure 102.

FIG. 6b shows an example for such a processing, wherein portions 104 are removed, such that a mechanical force is applied to the fin-shaped semiconductor structure 102, for example, by the influence of gravity pointing in a direction 106. However, even if no gravity displacement is desirable, subsequent processing, i.e., application of gate-structures in a direction perpendicular to the longitudinal direction of the fin-shaped semiconductor structure 102 would result in a deflection of the fin-shaped structure 102, as it is no longer supported by the support substrate 100.

That is, according to the embodiment discussed in FIGS. 6a and 6b, fins could be either attached on the bottom for bulk or FDSOI substrates (fully depleted silicon-on-insulator) or, in the case of FDSOI, the BOX (buried oxide) can be etched away under the fin. This would change the way the fin is strained in different directions, which could offer benefits for different kinds of devices.

Instead of bending the fin by applying alternating compressive or tensile stress (FIGS. 3-5), only tensile or compressive stress materials could be applied on only one side of the fin-shaped structure. These would also provide compressive or tensile stress to the fin perpendicular to the channel direction. With reduced production effort, a tensile strain could also be provided, which causes a mobility improvement of the charge carriers for various device types.

Figure 7A:
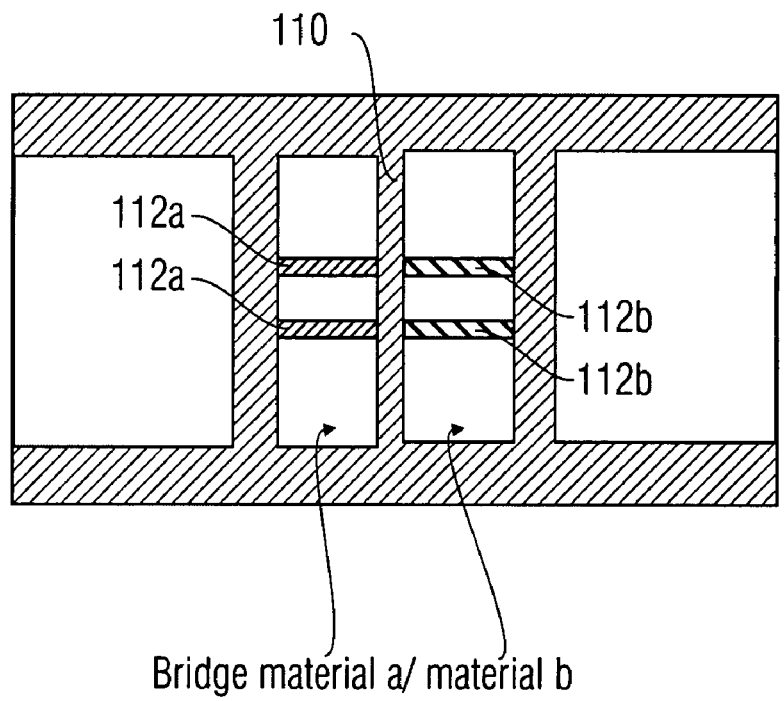
FIGS. 7a and 7b show a further alternative embodiment for fabricating a fin-shaped semiconductor structure that is strained in a longitudinal direction.
Figure 7B:
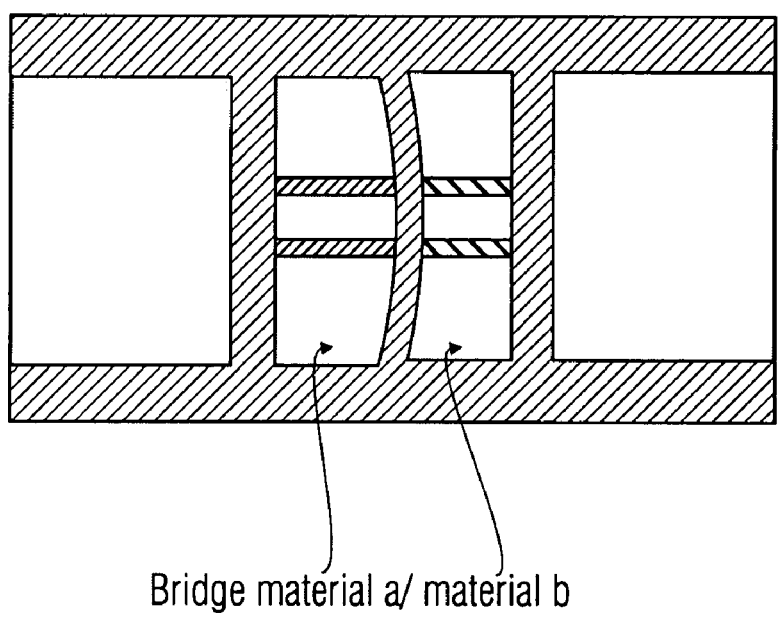

FIGS. 7a and 7b show a further alternative embodiment for fabricating a fin-shaped semiconductor structure that is strained in a longitudinal direction. FIG. 7a shows a semiconductor fin-shaped structure 110, to which bridge material 112a is connected on a first side face and to which different bridge material 112b is connected on a second side face, which is opposite to the first side face. Provided the bridge materials 112a and 112b have different thermal expansion behavior (e.g., different thermal expansion coefficients or different volume changes due to phase or bonding modification), a thermal treatment results in different elongation or contraction of the bridge materials 112a and 112b and, therefore, these bridges can deform the fins due to different amounts of expansion/contraction, as indicated in FIG. 7b. If the expansion or contraction is reversible, an amorphization and subsequent recrystallization is required before the thermal treatment is performed, in order to preserve the strain after the application of the stress to the fin structure has ended.

Again, the required treatment is not limited to a thermal treatment. Instead, irradiation, the application of reactive gases or other processes (e.g., implantation) could be used to activate the bridge material 112a and 112b, i.e., to change the material's geometrical dimensions.

As the previously discussed embodiments of the present invention have shown, the simple application of appropriate materials using standard techniques provides a possibility to strain fin-shaped semiconductor structures in a semiconductor process, arriving at fin-shaped structures being strained in a longitudinal direction.

The application of the inventive concept is by no means restricted to a single compressive and/or tensile material. Amongst all possible materials, $Si_3N_4$ or titanium nitride may, for example, be used, which can be transformed from having a compressive characteristic to having a tensile characteristic by irradiation with UV light or with a laser irradiation.

Embodiments concern a method in which converting the compressive material may comprise heating or irradiating a portion of the compressive material to be converted. The tensile material may be converted into compressive material by increasing the volume of the material. The volume may be increased by the addition of dopant atoms or particles into the tensile material. The particles may be added by implantation or by the diffusion of atoms or particles deposited on the surface of the tensile material.

Embodiments concern a method for fabricating a semiconductor device comprising the fin-shaped structure and a gate. A layer of insulating material may be formed between the gate region and the fin-shaped semiconductor structure.

What is claimed is:

1. A method for fabricating a fin-shaped semiconductor structure, the method comprising:
    forming a fin-shaped structure from a semiconductor material; and
    processing the fin-shaped structure for generating a strain within the semiconductor material along a longitudinal direction of the fin-shaped structure,
    wherein processing further comprises:
        applying compressive material to a first side face of the fin-shaped structure thereby applying a compressive force to the first side face, the first side face being perpendicular to the longitudinal direction; and
        applying the compressive material to a second side face, the second side face being opposite to the first side face; and
        converting the compressive material on the second side face into the tensile material thereby applying a tensile force to the first side face.

2. The method in accordance with claim 1, wherein applying the compressive material comprises:
    connecting a first material with a first thermal expansion property to the first side face of the fin-shaped structure; and
    exposing the fin-shaped structure to at least one of optical irradiation, thermal irradiation and ion bombardment.

3. The method in accordance with claim 1, wherein the fin-shaped structure is formed from an amorphous or an amorphized crystalline semiconductor material, wherein the processing further comprises:
    converting the strained semiconductor material into a crystalline state; and
    releasing the strain.

4. The method in accordance with claim 1, wherein:
    forming the fin-shaped structure comprises forming the fin-shaped structure on a support substrate; and
    processing the fin-shaped structure comprises removing, at least partly, portions of the support substrate supporting the fin-shaped structure.

5. The method in accordance with claim 1, wherein the fin-shaped structure is manufactured with the longitudinal direction along the <110> direction on a semiconductor substrate with a (001) surface orientation.

6. The method in accordance with claim 1, wherein the fin-shaped structure is formed in a predetermined orientation with respect to a crystal orientation of the semiconductor material so that the generation of the strain along the longitudinal direction increases electron mobility in the longitudinal direction of the fin-shaped structure.

7. The method in accordance with claim 1, wherein the fin-shaped structure is formed in a predetermined orientation with respect to a crystal orientation of the semiconductor material so that the generation of the strain along the longitudinal direction increases hole mobility in the longitudinal direction of the fin-shaped structure.

8. The method in accordance with claim 1, wherein the fin-shaped structure is formed in a predetermined orientation with respect to a crystal orientation of the semiconductor material so that the generation of the strain along the longitudinal direction increases charge carrier mobility in the longitudinal direction of the fin-shaped structure.

9. The method in accordance with claim 1, the method further comprising:
    forming a source region; and
    forming a drain region spaced apart from the source region in a longitudinal direction;
    wherein the fin-shaped semiconductor structure connects connecting the source region and the drain region along the longitudinal direction.

10. The method of claim 9, further comprising forming a gate region in a direction perpendicular to the longitudinal direction of the fin-shaped semiconductor structure, the gate region at least partly covering a surface of the fin-shaped semiconductor structure.

11. A method for fabricating a fin-shaped structure, the method comprising:
    forming a fin-shaped structure from a semiconductor material; and
    processing the fin-shaped structure for generating a strain within the semiconductor material along a longitudinal direction of the fin-shaped structure,
    wherein processing further comprises:
        applying tensile material to a second side face of the fin-shaped structure thereby applying a tensile force to the first side face, the second side face being perpendicular to the longitudinal direction; and
        applying the tensile material to the first side face, the first side face being opposite to the second side face; and
        converting the tensile material on the first side face into the compressive material thereby applying a compressive force to the first side face.

12. The method in accordance with claim 11, wherein applying the tensile material comprises:
    connecting a first material with a first thermal expansion property to the second side face of the fin-shaped structure; and
    exposing the fin-shaped structure to at least one of optical irradiation, thermal irradiation and ion bombardment.

13. The method in accordance with claim 11, the method further comprising:
    forming a source region; and
    forming a drain region spaced apart from the source region in a longitudinal direction;
    wherein the fin-shaped semiconductor structure connects the source region and the drain region along the longitudinal direction.

14. A method for fabricating a fin-shaped semiconductor structure, the method comprising:

forming a fin-shaped structure from a semiconductor material; and processing the fin-shaped structure for generating a strain within the semiconductor material along a longitudinal direction of the fin-shaped structure, wherein the processing comprises applying tensile and/or compressive force to a side face of the fin-shaped structure in a direction perpendicular to the longitudinal direction, wherein applying tensile and/or compressive force comprises:
 connecting a first material with a first thermal expansion property to a first side face of the fin-shaped structure;
 applying a second material with a second thermal expansion property differing from the first thermal expansion property to a second side face of the fin-shaped structure; and
 heating or cooling the fin-shaped structure.

15. The method in accordance with claim 14, the method further comprising:
 forming a source region; and
 forming a drain region spaced apart from the source region in a longitudinal direction;
 wherein the fin-shaped semiconductor structure connects the source region and the drain region along the longitudinal direction.

16. A method for fabricating a semiconductor device, the method comprising:
 forming a source region;
 forming a drain region spaced apart from the source region in a longitudinal direction;
 forming a fin-shaped semiconductor structure connecting the source region and the drain region in the longitudinal direction;
 forming a dummy gate region in a direction perpendicular to the longitudinal direction, the dummy gate region at least partly covering a surface of the fin-shaped structure;
 after forming the dummy gate region, applying a tensile and/or compressive force to the fin-shaped semiconductor structure in a direction perpendicular to the longitudinal direction; and
 removing the dummy gate region after applying the tensile and/or compressive force.

17. The method in accordance with claim 16, further comprising forming a gate region in a direction perpendicular to the longitudinal direction, the gate region at least partly covering a surface of the fin-shaped semiconductor structure.

* * * * *